(12) United States Patent
Ripley

(10) Patent No.: US 7,408,413 B2
(45) Date of Patent: *Aug. 5, 2008

(54) CIRCUIT FOR ACCURATELY CONTROLLING POWER AMPLIFIER OUTPUT POWER

(75) Inventor: David S. Ripley, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/899,925

(22) Filed: Sep. 7, 2007

(65) Prior Publication Data

US 2008/0001670 A1 Jan. 3, 2008

Related U.S. Application Data

(63) Continuation of application No. 11/061,679, filed on Feb. 17, 2005, now Pat. No. 7,288,991.

(51) Int. Cl.
*H03G 3/10* (2006.01)
(52) U.S. Cl. .................................................. 330/285
(58) Field of Classification Search ........................ None
See application file for complete search history.

(56) References Cited

U.S. PATENT DOCUMENTS

| | | | | |
|---|---|---|---|---|
| 4,346,343 A * | 8/1982 | Berndlmaier et al. ....... | 323/282 |
| 4,574,801 A * | 3/1986 | Manes ......................... | 606/38 |
| 5,864,110 A * | 1/1999 | Moriguchi et al. ..... | 219/121.57 |
| 6,122,180 A * | 9/2000 | Seo et al. .................. | 363/21.17 |
| 6,430,402 B1 * | 8/2002 | Agahi-Kesheh .......... | 455/115.3 |
| 6,522,202 B2 * | 2/2003 | Brandt ....................... | 330/285 |
| 6,545,541 B2 * | 4/2003 | Pehlke et al. ................ | 330/296 |
| 6,665,525 B2 * | 12/2003 | Dent et al. .................. | 455/108 |
| 6,756,849 B2 * | 6/2004 | Dupuis et al. ............... | 330/279 |
| 6,917,245 B2 * | 7/2005 | Dupuis et al. ............... | 330/279 |
| 6,940,981 B2 * | 9/2005 | Neunaber .................... | 381/55 |
| 7,088,598 B2 * | 8/2006 | Yang et al. ............... | 363/21.01 |
| 2006/0270366 A1 * | 11/2006 | Rozenblit et al. ........ | 455/127.1 |

* cited by examiner

*Primary Examiner*—Robert J. Pascal
*Assistant Examiner*—Krista M Flanagan
(74) *Attorney, Agent, or Firm*—Farjami & Farjami LLP

(57) ABSTRACT

According to an exemplary embodiment, an amplification module includes a power control circuit. The amplification module further includes a power amplifier coupled to the power control circuit and configured to draw a supply current and receive a supply voltage from the power control circuit. The power control circuit is configured to control a DC power provided to the power amplifier by controlling a product of a sense current, which is a mirror current of the supply current, and the supply voltage. The power control circuit includes a feedback voltage that corresponds to the product of the sense current and the supply voltage. The power control circuit further includes an analog multiplier circuit configured to receive the sense current and the supply voltage and generate the feedback voltage. The power control circuit further includes a differential error amplifier configured to compare the feedback voltage to a control voltage.

19 Claims, 3 Drawing Sheets

CIRCUIT FOR ACCURATELY CONTROLLING POWER AMPLIFIER OUTPUT POWER

This is a continuation of application Ser. No. 11/061,679 filed Feb. 17, 2005 now U.S. Pat. No. 7,288,991.

BACKGROUND OF THE INVENTION

1. Field of the Invention

The present invention is generally in the field of electrical circuits. More specifically, the invention is in the field of power amplifiers.

2. Related Art

Power amplifiers used in the transmitter section of communications devices, such a wireless handsets, are required to operate under a wide variety of operating conditions, such as variations in temperature and supply voltage, and variations in load impedance. Under these varying operating conditions and load impedance, it is highly desirable for power amplifiers to maintain a constant output power. As a result, various techniques have been employed in an attempt to control the output power of a power amplifier.

However, current techniques for controlling the output power of a power amplifier suffer various disadvantages. For example, techniques that indirectly control the output power by controlling the voltage or current, such as collector voltage or collector current, supplied to the power amplifier provide adequate compensation for variations in operating conditions, but undesirably allow significant variations in power delivered to the load. For example, in the voltage or current control techniques discussed above, the power delivered to the load by the power amplifier can vary by as much as 10.0 decibels (dB) as the impedance of the load changes.

In another conventional approach, a coupler having directivity greater than approximately 10.0 dB is implemented to couple to and sense the output power delivered to the load. However, this approach requires radio frequency (RF) circuitry for detecting and controlling the output power of the power amplifier, which increases cost and circuit design complexity. Additionally, this approach can also cause undesirable frequency variations in the RF output signal generated by the power amplifier, which require system level calibration for correction.

Thus, there is a need in the art for a cost-effective power control circuit that accurately controls the output power of a power amplifier.

SUMMARY OF THE INVENTION

The present invention is directed to power control circuit for accurate control of power amplifier output power. The present invention addresses and resolves the need in the art for a cost-effective power control circuit that accurately controls the output power of a power amplifier.

According to an exemplary embodiment, an amplification module includes a power control circuit. The amplification module further includes a power amplifier coupled to the power control circuit, where the power amplifier is configured to draw a supply current and receive a supply voltage from the power control circuit. For example, the supply voltage may be a collector voltage of the power amplifier. For example, the supply current may be a collector current of the power amplifier. The power control circuit is configured to control a DC power provided to the power amplifier by controlling a product of a sense current and the supply voltage. The sense current is a mirror current of the supply current.

According to this exemplary embodiment, the power control circuit includes a feedback voltage, where the feedback voltage corresponds to the product of the sense current and the supply voltage. The power control circuit further includes an analog multiplier circuit, where the analog multiplier circuit is configured to receive the sense current and the supply voltage and to generate the feedback voltage. The power control circuit further includes a differential error amplifier, where the differential error amplifier is configured to compare the feedback voltage to a control voltage and to generate an error voltage corresponding to a difference between the feedback voltage and the control voltage. The power amplifier includes a final output stage, where the power control circuit provides the DC power only to the final output stage of the power amplifier. For example, the final output stage can be a gallium arsenide bipolar transistor.

The amplification module further includes a load coupled to the power amplifier, where the power amplifier provides an RF output power to the load, and where the power control circuit controls the RF output power by controlling the DC power provided to the power amplifier. Other features and advantages of the present invention will become more readily apparent to those of ordinary skill in the art after reviewing the following detailed description and accompanying drawings.

DETAILED DESCRIPTION OF THE INVENTION

The present invention is directed to power control circuit for accurate control of power amplifier output power. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
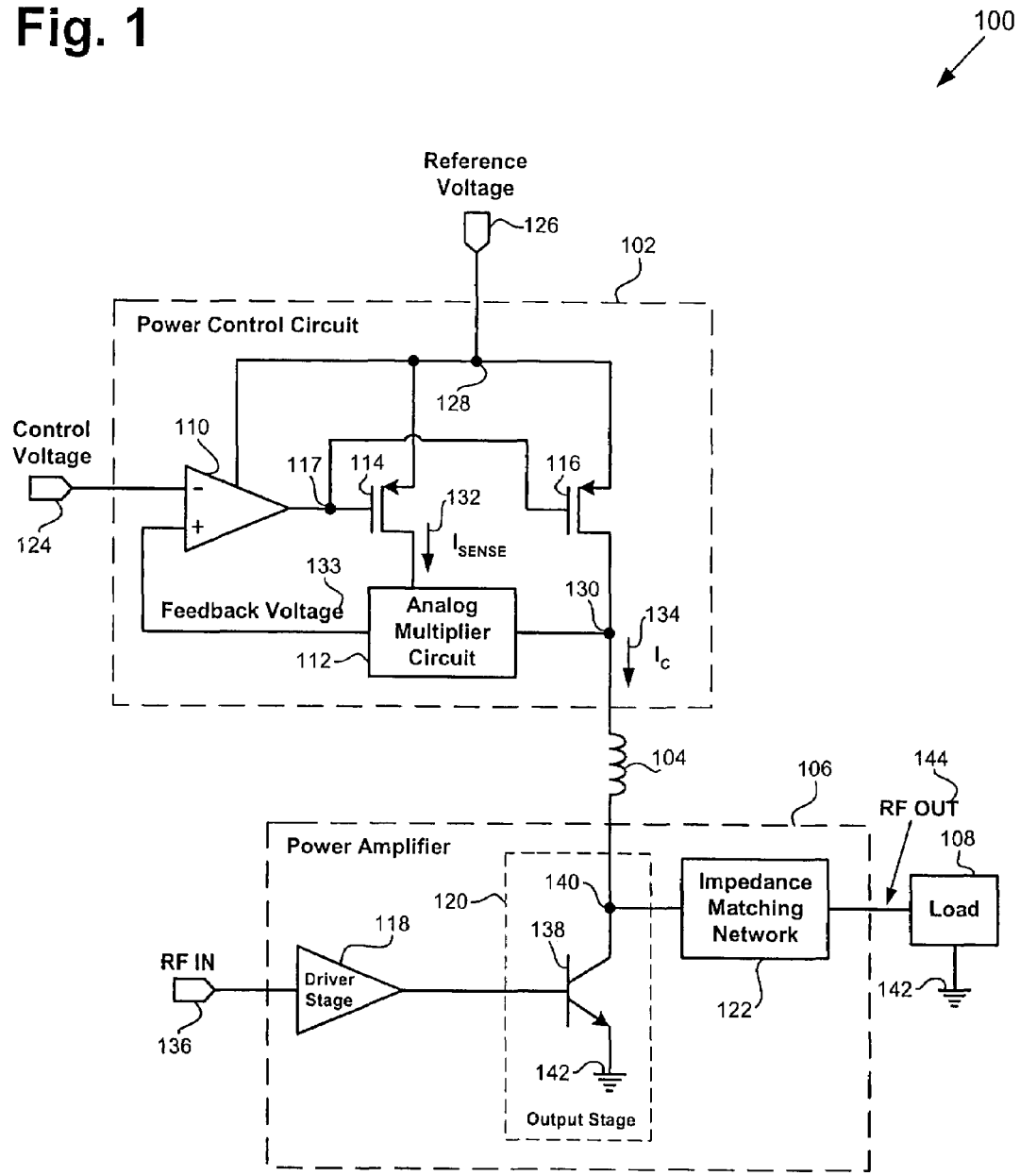
FIG. 1 is a circuit diagram of an exemplary amplification module including an exemplary power control circuit coupled to an exemplary power amplifier in accordance with one embodiment of the present invention.

FIG. 1 shows a circuit diagram of an exemplary amplification module including an exemplary power control circuit and an exemplary power amplifier in accordance with one embodiment of the present invention. Certain details and features have been left out of FIG. 1, which are apparent to a person of ordinary skill in the art. Amplification module 100 includes power control circuit 102, inductor 104, power amplifier 106, and load 108. Amplification module 100 can be used in wireless communication devices, such as cellular handsets. Power control circuit 102 of amplification module 100 can be fabricated, for example, on a single semiconductor die. Power control circuit 102 includes differential error amplifier 110, analog multiplier circuit 112, and transistors 114 and 116. Power amplifier 106 includes power amplifier driver stage ("driver stage") 118, power amplifier output stage ("output stage") 120, and impedance matching network 122. Power amplifier 106 also includes other circuits not shown in FIG. 1 to preserve brevity. Although power amplifier 106 is shown as having only one driver stage (i.e. driver stage 118), power amplifier 106 can have any number of driver stages.

As shown in FIG. 1, control voltage 124 is coupled to the negative terminal of differential error amplifier 10, which also serves as an input of power control circuit 102. Control voltage 124 is a DC reference voltage that is utilized to determine a level of DC power that power control circuit 102 provides to power amplifier 106. By way of example, control voltage 124 can have a range of between approximately 0.0 volts and approximately 3.0 volts. Also shown in FIG. 1, feedback voltage 133, which is generated by analog multiplier circuit 112, is coupled to the positive terminal of differential error amplifier 110, and the output of differential error amplifier 110 is coupled to the gate terminals of transistors 114 and 116 at node 117. Differential error amplifier 110 can be configured to compare feedback voltage 133, which is inputted at the positive terminal of differential error amplifier 110, to control voltage 124, which is inputted at the negative terminal of differential error amplifier 110, and output an error voltage, which corresponds to the difference between feedback voltage 133 and control voltage 124. The error voltage outputted by differential error amplifier 110 is coupled to the gate terminals of transistors 114 and 116 to appropriately drive transistors 114 and 116.

Further shown in FIG. 1, the source terminals of transistors 114 and 116 and a voltage input terminal of differential error amplifier 110 are coupled to reference voltage 126 (i.e. VCC) at node 128. In one embodiment, reference voltage 126 may be provided by a battery. Also shown in FIG. 1, the drain terminal of transistor 114 is coupled to one input of analog multiplier circuit 112 and the drain terminal of transistor 116 is coupled to another input of analog multiplier circuit and a first terminal of inductor 104 at node 130. Node 130, which is also the output of power control circuit 102, provides a DC supply voltage to output stage 120 of power amplifier 106. In the present embodiment, the DC supply voltage provided at node 130 is a collector voltage. In another embodiment, the DC supply voltage provided at node 130 may be a voltage other than a collector voltage. In the present embodiment, transistors 114 and 116 can each be p-channel field-effect transistors ("PFETs"). In other embodiments, transistors 114 and 116 may each be an NPN transistor or other appropriate type of transistor.

As shown in FIG. 1, the gate terminal of transistor 114 is coupled to the gate terminal of transistor 116 in a current mirror configuration; that is, during operation, $I_{SENSE}$ 132, which is the current controlled by transistor 114 and drawn by analog multiplier circuit 112, is directly proportional to $I_C$ 134, which is the DC supply current controlled by transistor 116 and drawn by output stage 120 of power amplifier 106. The current mirror formed by transistors 114 and 116 has a mirror ratio equal to K, where K is determined by the size of transistor 116 with respect to the size of transistor 114. By way of example, K can be approximately 300.0. In the present embodiment, $I_C$ 134 is the collector current drawn by output stage 120 of power amplifier 106. In another embodiment, $I_C$ 134 may be a DC supply current other than a collector current. By way of example, $I_C$ 134 might be approximately 1.6 amperes. By way of example, $I_{SENSE}$ 132 might be approximately 5.0 milliamperes ("mA").

Analog multiplier circuit 112 can be configured to receive $I_{SENSE}$ 132, which is proportional to $I_C$ 134 (i.e. the collector current drawn by output stage 120 of power amplifier 106) at one input and a DC supply voltage (i.e. the collector voltage provided to output stage 120 of power amplifier 106 at node 130) at another input, and to generate feedback voltage 133, which corresponds to the product of $I_{SENSE}$ 132 multiplied by the DC supply voltage. The product of $I_{SENSE}$ 132 and the DC supply voltage at node 130 is also proportional to the DC power provided to output stage 120 of power amplifier 106 by power control circuit 102.

Also shown in FIG. 1, RF input signal ("RF IN") 136 is coupled to the input of driver stage 118 of power amplifier 106. Driver stage 118 can be configured to receive and amplify RF IN 136 and generate a driver output RF signal, which is coupled to the base terminal of transistor 138 of output stage 120. The base terminal of transistor 138 also serves as an input to output stage 120 of power amplifier 106. Further shown in FIG. 1, a second terminal of inductor 104 is coupled to the collector terminal of transistor 138 and a first terminal of impedance matching network 122 at node 140 and the emitter terminal of transistor 138 is coupled to ground 142. Transistor 138 can be an NPN power output transistor and can comprise, for example, gallium arsenide. In other embodiments, transistor 138 may comprise a material other than gallium arsenide and may be a power transistor other than an NPN power output transistor, such as a FET. Output stage 120, which is the final output stage of power amplifier 106, can be configured to receive and amplifier an RF signal outputted by driver stage 118, and generate RF output signal ("RF OUT") 144. Output stage 120 can also be configured to draw a collector current (i.e. $I_C$ 134) and receive a collector voltage (i.e. DC supply voltage at node 130) from power control circuit 102.

Also shown in FIG. 1, a second terminal of impedance matching network 122 is coupled to a first terminal of load 108, which may be, for example, an antenna. The second terminal of impedance network 122 also serves as the output of power amplifier 106. Power amplifier 106 can be configured to receive and amplify RF IN 136, draw a collector current (i.e. $I_C$ 134) and receive a collector voltage (i.e. DC supply voltage at node 130) from power control circuit 102 for output stage 120, and generate RF OUT 144. Impedance network 122 can be configured to match the impedance of output stage 120 at node 140 to the impedance of load 108. As further shown in FIG. 1, a second terminal of load 108 is coupled to ground 142.

The function and operation of power control circuit 102 will now be discussed. In power control circuit 102, analog multiplier circuit 112, differential error amplifier 110, and the current mirror configuration comprising transistors 114 and 116 form a feedback loop for controlling the DC power provided to output stage 120, which is equal to the product of $I_C$ 134 (i.e. the collector current drawn by output stage 120 of power amplifier 106) and the DC supply voltage (i.e. the collector voltage) coupled to output stage 120 of power amplifier 106 at node 130. As discussed above, analog multiplier circuit 112 is configured to receive the DC supply voltage at node 130 and to receive $I_{SENSE}$ 132, which is directly proportional to $I_C$ 134 (i.e. the collector current drawn by output stage 120), and to generate feedback voltage 133, which corresponds to the product of $I_{SENSE}$ 132 and the DC supply voltage at node 130. Differential error amplifier 110 compares feedback voltage 133 to control voltage 124, which determines a desired level of DC power delivered to output stage 120 of power amplifier 106 by power control circuit 102.

When $I_C$ 134 (i.e. the collector current drawn by output stage 120) increases, the increase in $I_C$ 134 causes a proportional increase in $I_{SENSE}$ 132, since transistor 114, which controls $I_{SENSE}$ 132, and transistor 116, which controls $I_C$ 134, are coupled in a current mirror configuration. Since an increase in $I_C$ 134 also causes an increase in the DC supply voltage at node 130, feedback voltage 133, which corresponds to the product of I $I_{SENSE}$ 132 and the DC supply voltage at node 130, will also increase. If $I_C$ 134 increases sufficiently to cause feedback voltage 133 to be greater than control voltage 124, differential error amplifier 110 generates a positive error voltage, which is proportional to the difference between feedback voltage 133 and control voltage 124. The positive error voltage is applied to the gate of transistor 116, which is configured to cause an appropriate reduction in $I_C$ 134 (i.e. the collector current drawn by output stage 120). The reduction in $I_C$ 134 also causes a reduction in the DC supply voltage at node 130. Since $I_{SENSE}$ 132 is a mirror current of $I_C$ 134, a reduction in $I_C$ 134 also causes a corresponding reduction in $I_{SENSE}$ 132. As a result, feedback voltage 133, which corresponds to the product of $I_{SENSE}$ 132 and the DC supply voltage at node 130, will also be reduced.

Conversely, if $I_C$ 134 decreases sufficiently to cause feedback voltage 133 to be less than control voltage 124, differential error amplifier 110 generates a negative error voltage. The negative error voltage is applied to the gate of transistor 116, which is configured to cause an appropriate increase in $I_C$ 134. The increase in $I_C$ 134 causes a corresponding increase in the DC supply voltage at node 130 and also causes a proportional increase in $I_{SENSE}$ 132. As a result, feedback voltage 133, which corresponds to the product of $I_{SENSE}$ 132 and the DC supply voltage at node 130, also increases. Thus, by appropriately responding to either a decrease or increase in $I_C$ 134, the feedback loop discussed above regulates the DC supply voltage at node 130 (i.e. the collector voltage supplied to output stage 120) and controls the DC power (i.e. the product of collector current and collector voltage) provided to output stage 120 of power amplifier 106.

By way of background, the RF output power delivered to a load by a power amplifier is approximately equal to the DC power supplied to the final output stage of the power amplifier times the efficiency of the final output stage, which remains substantially constant over a wide variation of RF output power. Thus, by utilizing a feedback loop to accurately control the DC power supplied to output stage 120, which is the final output stage of power amplifier 106, the present invention's power control circuit (i.e. power control circuit 102) accurately controls the RF output power provided to load 108 by power amplifier 106. In the present invention, only the DC power supplied to the final output stage (i.e. output stage 120) of power amplifier 106 is controlled, because only the DC power supplied to the final output stage of power amplifier 106 determines the RF output power supplied to the load (i.e. load 108).

Figure 2:
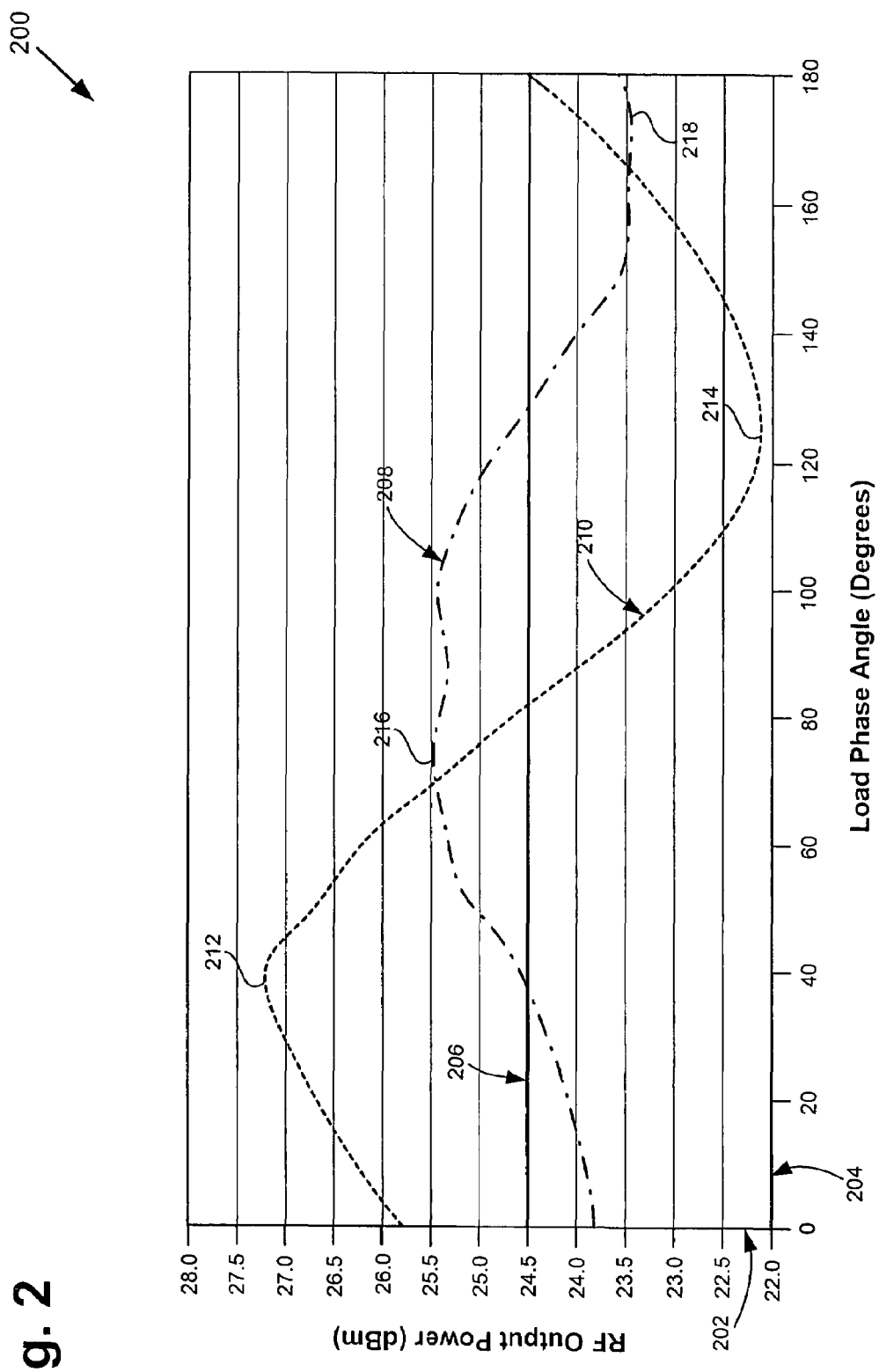
FIG. 2 is a graph showing RF output power curves in accordance with one embodiment of the present invention.

FIG. 2 shows exemplary graph 200 including RF output power curves in accordance with one embodiment of the present invention. Graph 200 includes RF output power axis 202, load phase angle axis 204, and RF output power curves 206, 208, and 210. In graph 200, RF output power axis 202 corresponds to an exemplary range of RF output power supplied to load 108 by power amplifier 106 in FIG. 1, while load phase angle axis 204 corresponds to an exemplary phase angle range of the load impedance of load 108.

In graph 200, RF output power curve 206 corresponds to the RF output power delivered to load 108 by power amplifier 106 over a voltage standing wave ratio ("VSWR") of 3:1 under different load impedance phase angles, where load 108 has a constant load impedance of 50.0 ohms. RF output power curve 208 corresponds to the RF output power delivered to load 108 by power amplifier 106 over a VSWR of 3:1 under different load impedance phase angles, where the DC power delivered to output stage 120 of power amplifier 106 is controlled by power control circuit 102. RF output power curve 210 corresponds to the RF output power of power amplifier 106 delivered to load 108 over a VSWR of 3:1 under different load impedance phase angles, where only the collector voltage of output stage 120 of power amplifier 106 is controlled.

In the example shown in graph 200, RF output power curve 206, which corresponds to an ideal RF output power curve, provides a constant RF output power of 24.5 dBm under different load impedance phase angles. Also shown in the example in graph 200, RF output power curve 210, which corresponds to a conventional power output control technique of controlling only the collector voltage of output stage 120 of power amplifier 106, provides an RF output power variation of approximately 5.0 dBm between upper peak 212 and lower peak 214 of RF output power curve 210. Further shown in the example in graph 200, RF output power curve 208, which corresponds to an RF output power curve achieved by the present invention's power control circuit, provides an RF output power variation of approximately 2.0 dBm between upper peak 216 and lower peak 218 of RF output power curve 208.

Thus, as shown in the example in graph 200, by controlling the DC power provided to output stage 120 of power amplifier 106, the present invention's power control circuit 102 limits the RF output power variation over a 3:1 VSWR to approximately 2.0 dBm. In contrast, by conventionally controlling only the collector current provided to output stage 120, the RF output power over a 3:1 VSWR varies by approximately 5.0 dBm, which is significantly greater than the variation achieved by the present invention's power control circuit.

Figure 3:
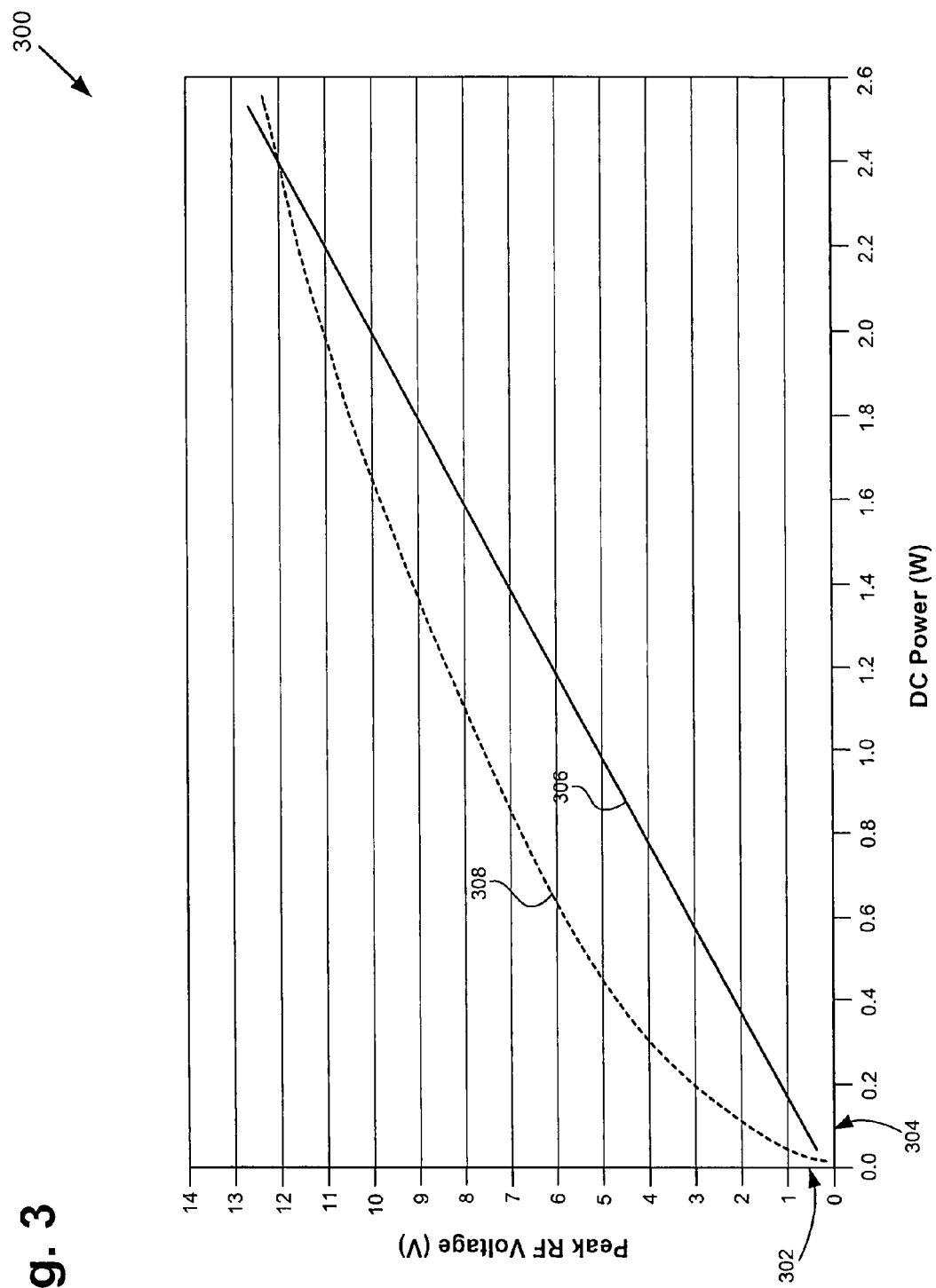
FIG. 3 is a graph showing DC power control response curves in accordance with one embodiment of the present invention.

FIG. 3 shows exemplary graph 300 including DC power control response curves in accordance with one embodiment of the present invention. Graph 300 includes peak RF voltage axis 302, DC power axis 304, and DC power control response curves 306 and 308. In graph 300, peak RF voltage axis 302 corresponds to an exemplary range of the peak RF voltage of RF OUT 144 generated by output stage 120 of power amplifier 106 in FIG. 1, while DC power axis 304 corresponds to an exemplary range of DC power provided to output stage 120.

In graph 300, DC power control response curve 306 corresponds to an ideal DC power control response curve, which shows a linear relationship between peak RF voltage of RF OUT 144 (i.e. the RF output signal generated by output stage 120 of power amplifier 106) and the DC power provided to output stage 120. DC power control response curve 308 corresponds to the embodiment of the present invention in FIG. 1, where the output of analog multiplier circuit 112 (i.e. feedback voltage 133) is applied directly to the positive terminal of differential error amplifier 110. As shown in graph 300, DC power control response curve 308 shows a non-linear relationship between the peak RF voltage of RF OUT 144 and the DC power provided to output stage 120 of power amplifier 106. In the embodiment of the present invention in FIG. 1, the DC power provided to output stage 120 of power amplifier 106 is directly proportional to control voltage 124. As a result, the peak RF voltage of RF OUT 144 has a non-linear relationship to control voltage 124.

In one embodiment, in order to achieve a substantially linear relationship between peak RF voltage of RF OUT 144 and the DC power provided to output state 120 by power control circuit 102, which is desirable in some applications, a square law distortion circuit can be added between analog multiplier circuit 112 and the positive terminal of differential error amplifier 110. In such embodiment, the square-law distortion circuit can be configured to receive feedback voltage 133 and generate an output voltage that is a square-law function of feedback voltage 133, which would be applied to the positive terminal of differential error amplifier 110.

Thus, as discussed above, by using a feedback loop including a feedback voltage that corresponds to the product of a mirror current of a DC supply current drawn by a final output stage of a power amplifier and a DC supply voltage provided to the final output stage, the present invention's power control circuit advantageously controls the DC power provided to the final output stage of the power amplifier. By accurately controlling the DC power provided to the final output stage of the power amplifier, the present invention's power control circuit advantageously achieves accurate control of the RF output power supplied by the power amplifier to a load.

Additionally, the present invention's power control circuit achieves a significantly reduced variation in RF output power supplied by the power amplifier to a load compared to a conventional power control circuit that controls only the collector voltage supplied to the power amplifier. Furthermore, the present invention's power control circuit is cost-effectively and does not require complex RF coupling and detection circuits.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, power control circuit for accurate control of power amplifier output power has been described.

The invention claimed is:

1. A power control circuit coupled to a power amplifier, said power control circuit comprising:
    a supply voltage and a supply current, said supply voltage and said supply current being provided to said power amplifier;
    an analog multiplier circuit configured to receive said supply voltage and to generate a feedback voltage;
    wherein said power control circuit is configured to control a DC power provided to said power amplifier by controlling said feedback voltage.

2. The power control circuit of claim 1 wherein said analog multiplier circuit is further configured to receive a sense current, wherein said sense current is a mirror current of said supply current.

3. The power control circuit of claim 2 wherein said feedback voltage corresponds to a product of said supply voltage and said sense current.

4. The power control circuit of claim 1 further comprising a differential error amplifier, wherein said differential error amplifier is configured to compare said feedback voltage to a control voltage and to generate an error voltage corresponding to a difference between said feedback voltage and said control voltage.

5. The power control circuit of claim 4 further comprising a first transistor and a second transistor coupled to said differential error amplifier in a current mirror configuration, wherein said first transistor controls a sense current and said second transistor controls said supply current.

6. The power control circuit of claim 1 wherein said supply voltage is a collector voltage of said power amplifier.

7. The power control circuit of claim 1 wherein said supply current is a collector current of said power amplifier.

8. An amplification module comprising:
    a power amplifier coupled to a power control circuit, said power amplifier being configured to draw a supply current and receive a supply voltage from said power control circuit;
    wherein said power control circuit is configured to control a DC power provided to said power amplifier by controlling a feedback voltage generated in said power control circuit.

9. The amplification module of claim 8 wherein said feedback voltage corresponds to a product of a sense current and said supply voltage.

10. The amplification module of claim 9 wherein said sense current is a mirror current of said supply current.

11. The amplification module of claim 9 wherein said power control circuit further comprises an analog multiplier circuit configured to receive said sense current and said supply voltage and to generate said feedback voltage.

12. The amplification module of claim 9 wherein said power control circuit further comprises a differential error amplifier configured to compare said feedback voltage to a control voltage and to generate an error voltage corresponding to a difference between said feedback voltage and said control voltage.

13. The amplification module of claim 8 wherein said supply voltage is a collector voltage of said power amplifier.

14. An amplification module comprising:
    a power control circuit;
    a power amplifier coupled to said power control circuit, said power amplifier being configured to draw a supply current and receive a supply voltage from said power control circuit;
    wherein said power control circuit is configured to control a DC power provided to said power amplifier by controlling a product of a sense current and said supply voltage, wherein said sense current is a mirror current of said supply current.

15. The amplification module of claim 14 wherein said power control circuit comprises a feedback voltage corresponding to said product of said sense current and said supply voltage.

16. The amplification module of claim 15 wherein said power control circuit further comprises an analog multiplier circuit configured to receive said sense current and said supply voltage and to generate said feedback voltage.

17. The amplification module of claim 15 wherein said power control circuit further comprises a differential error amplifier configured to compare said feedback voltage to a control voltage and to generate an error voltage corresponding to a difference between said feedback voltage and said control voltage.

18. The amplification module of claim 14 wherein said supply voltage is a collector voltage of said power amplifier.

19. The amplification module of claim 14 wherein said supply current is a collector current of said power amplifier.

* * * * *